(12) United States Patent
Mathew et al.

(10) Patent No.: US 8,377,819 B2
(45) Date of Patent: *Feb. 19, 2013

(54) CONTACT FORMATION

(75) Inventors: James Mathew, Boise, ID (US); H. Montgomery Manning, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/237,126

(22) Filed: Sep. 20, 2011

(65) Prior Publication Data

US 2012/0009779 A1    Jan. 12, 2012

Related U.S. Application Data

(60) Continuation of application No. 12/787,684, filed on May 26, 2010, now Pat. No. 8,034,706, which is a continuation of application No. 12/401,996, filed on Mar. 11, 2009, now Pat. No. 7,737,022, which is a division of application No. 11/363,661, filed on Feb. 27, 2006, now abandoned.

(51) Int. Cl.
H01L 21/4763 (2006.01)

(52) U.S. Cl. ..................... 438/622
(58) Field of Classification Search ............. 438/622
See application file for complete search history.

(56) References Cited

U.S. PATENT DOCUMENTS

| | | | |
|---|---|---|---|
| 5,563,433 A * | 10/1996 | Nagata et al. | 257/301 |
| 5,759,892 A * | 6/1998 | Wang et al. | 438/254 |
| 5,858,851 A | 1/1999 | Yamagata et al. | |
| 5,940,714 A | 8/1999 | Lee et al. | |
| 6,066,556 A | 5/2000 | Jeong | |
| 6,174,767 B1 | 1/2001 | Chi | |
| 6,255,168 B1 | 7/2001 | Gau | |
| 6,376,353 B1 * | 4/2002 | Zhou et al. | 438/612 |
| 6,504,210 B1 | 1/2003 | Divakaruni et al. | |
| 6,861,313 B2 | 3/2005 | Song | |
| 7,074,717 B2 | 7/2006 | Rhodes | |
| 7,217,647 B2 | 5/2007 | Yang | |
| 7,737,022 B2 | 6/2010 | Mathew et al. | |
| 8,034,706 B2 * | 10/2011 | Mathew et al. | 438/622 |
| 2001/0049185 A1 | 12/2001 | Hosotani et al. | |
| 2002/0003266 A1 | 1/2002 | Manning | |
| 2003/0082900 A1 | 5/2003 | Peng et al. | |
| 2004/0036125 A1 | 2/2004 | Oh et al. | |

(Continued)

FOREIGN PATENT DOCUMENTS

| | | |
|---|---|---|
| JP | 9293781 A | 11/1997 |
| JP | 2001-007039 | 1/2001 |
| JP | 2004-241759 | 8/2004 |

OTHER PUBLICATIONS

International Search Report and Written Opinion for related PCT Application No. PCT/US2007/004573, Mailed Aug. 28, 2007 (15 pgs.).

(Continued)

*Primary Examiner* — Thao P. Le
(74) *Attorney, Agent, or Firm* — Brooks, Cameron & Huebsch, PLLC

(57) ABSTRACT

The present disclosure includes various methods of contact embodiments. One such method embodiment includes forming a trench in an insulator stack material of a particular thickness. This method includes forming a filler material in the trench and removing the filler material to a particular depth that is less than the particular thickness of the insulator stack material. This method also includes forming a spacer material on at least one side surface of the trench to the particular depth of the filler material and forming a conductive material in the trench over the filler material.

20 Claims, 7 Drawing Sheets

U.S. PATENT DOCUMENTS

| | | |
|---|---|---|
| 2004/0041204 A1 | 3/2004 | Ireland |
| 2004/0121536 A1 | 6/2004 | Hung et al. |
| 2004/0152294 A1 | 8/2004 | Choi |
| 2004/0161923 A1 | 8/2004 | Bae et al. |
| 2004/0173912 A1 | 9/2004 | Rhodes |
| 2005/0009270 A1 | 1/2005 | Parekh et al. |
| 2006/0001019 A1* | 1/2006 | Sandhu et al. ............... 257/31 |
| 2006/0148168 A1 | 7/2006 | Li et al. |
| 2006/0151821 A1 | 7/2006 | Melik-Martirosian et al. |
| 2006/0240654 A1 | 10/2006 | Wei et al. |
| 2006/0263979 A1 | 11/2006 | Nejad et al. |
| 2007/0048951 A1 | 3/2007 | Boubekeur et al. |

OTHER PUBLICATIONS

Notice of Rejection for related Japanese Application No. 2008-556414, mailed Sep. 25, 2012, (3 pgs.).

* cited by examiner

CONTACT FORMATION

CROSS-REFERENCE TO RELATED APPLICATION

This application is a continuation of U.S. application Ser. No. 12/787,684, filed May 26, 2010, which is a continuation of U.S. application Ser. No. 12/401,996, filed Mar. 11, 2009, issued as U.S. Pat. No. 7,737,022 on Jun. 15, 2010, which is a divisional of U.S. application Ser. No. 11/363,661, filed Feb. 27, 2006, the entire specification of which is incorporated herein by reference.

TECHNICAL FIELD

The present disclosure relates generally to semiconductor devices and, more particularly, to contact process technology for use in memory, image, logic, and other semiconductor devices.

BACKGROUND

Implementing electronic circuits involves connecting isolated devices or circuit components through specific electronic paths. In silicon integrated circuit (IC) fabrication, circuit components that are formed in a single substrate are often isolated from one another. The individual circuit components can be subsequently interconnected to create a specific circuit configuration.

The integrated circuit industry continues to progress in electronic circuit densification and miniaturization. This progress has resulted in increasingly compact and efficient semiconductor devices, which in turn enable the systems into which these devices are incorporated to be made smaller and less power consumptive.

During the formation of semiconductor devices, such as dynamic random access memories (DRAMs), static random access memories (SRAMs), microprocessors, etc., insulating layers, such as silicon dioxide, phosphorous doped silicon dioxide, or other materials, can be used to electrically separate conductive layers, such as doped polycrystalline silicon, doped silicon, aluminum, refractory metal silicides, and layers formed from other conductive materials.

In fabricating electronic circuits, layers of material are applied over each other to provide various features to the circuits. During this process portions or entire layers can be removed in order for layer underneath to be accessed. In some fabrication methods, additional materials can be used to fill in the removed portions. Such layering and removing processes can include, deposition, etching, planarizing, photolithography, among other processes.

In many devices, conductive layers can be interconnected through openings in the insulating layer. Such openings are commonly referred to as contact openings (e.g., when the opening extends through an insulating layer to an active device area). Generally, such openings are also referred to as holes or vias (i.e., when the opening extends through an insulating layer between two conductive layers).

In addition to size, the time it takes and material used in a manufacturing process can be important factors in circuit design. For example, aspects that can be changed that can benefit the manufacturing process include the number of layering processes, the time taken to perform the processes, and/or the amount of materials used in these processes can be reduced.

BRIEF DESCRIPTION OF THE DRAWINGS

Features and advantages of the present disclosure will become more apparent from the following detailed description of the embodiments described below in detail with reference to the accompanying drawings where.

DETAILED DESCRIPTION

Figure 1:
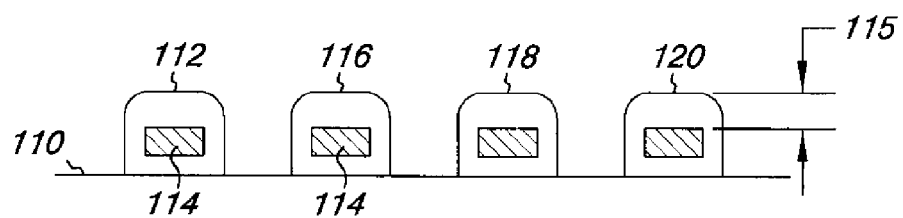
FIG. 1 is a cross-sectional view of an exemplary portion of an embodiment of an in-process contact structure in accordance with the present disclosure.

The present disclosure includes various method, circuit, device, and system embodiments. Various embodiments disclosed herein can be used to reduce the number of layering processes, the time taken to perform the processes, and/or the amount of materials used in these processes can be reduced, among other benefits.

One such method embodiment includes creating a trench in an insulator stack material having a portion of the trench positioned between two of a number of gates and depositing a spacer material to at least one side surface of the trench. This method also includes depositing a conductive material into the trench and depositing a cap material into the trench.

In some embodiments, the number of gates can each have a cap that has a height of 1500 angstroms or less. Embodiments can include creating a number of gates, for example, each having a cap that has a height of approximately 700 angstroms. In various embodiments, the number of gates can each have a cap that has a height of 700 angstroms or less.

The terms "substrate" or "substrate assembly" as used herein refer to a semiconductor substrate such as a base semiconductor layer or a semiconductor substrate having one or more layers, structures, and/or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures/features, and/or openings such as capacitor plates and/or barriers for capacitors.

"Layer" as used herein refers to any layer that can be formed on a substrate using a deposition or other process. The term "layer" is meant to include layers specific to the semiconductor industry, such as "barrier layer," "dielectric layer," and "conductive layer." (The term "layer" is synonymous with the term "film" as it is used in the semiconductor industry). The term "layer" is also meant to include layers found in technology outside of semiconductor technology, such as coatings on glass.

In the Figures, the first digit or two (i.e., first digit for three digit numbers and first two digits for four digit numbers) of a reference number refers to the Figure in which it is used, while the remaining two digits of the reference number refer to the same or equivalent parts of embodiment(s) of the present disclosure used throughout the several figures of the drawing. The scaling of the figures does not represent precise dimensions of the various elements illustrated therein.

Embodiments of the present disclosure will now be described in detail with reference to the accompanying figures. It should be noted that although the figures illustrate one conductor being formed, the various embodiments contemplated herein can have any number of conductors formed therein.

FIG. 1 is a cross-sectional view of an exemplary portion of an embodiment of an in-process contact structure in accordance with the present disclosure. In this embodiment, a number of gate structures 112, 116, 118, and 120 have been formed on a substrate 110.

Each gate structure, in the embodiment illustrated in FIG. 1, includes a polysilicon structure 114 which can be used a contact or a portion thereof. Although a particular type of gate structure is illustrated, various types of gate structures can be used in the various embodiments of the present disclosure. Additionally, in various embodiments, components can be formed within the substrate 110 below the level on which the gates 112, 116, 118, and 120 are formed.

In various embodiments of the present disclosure it is possible to form a gate cap (e.g., gate cap 115 of FIG. 1) having a thickness of less than 1500 angstroms (A). In many contact fabrication processes gate cap thicknesses are at least 1500 A because the cap may be exposed to one or more planarization processes.

As discussed herein, in some embodiments of the present disclosure, the contact can be formed without exposure of the cap to planarization processes. Accordingly, the cap thickness can be reduced. For example, in some embodiments, the cap thickness can be approximately 700 A. This can be beneficial in: the ease of patterning a gate or contact structure, reducing the vertical size of the components, reducing the time used for contact formation, and reducing the amount of material utilized, among other benefits.

Figure 2:
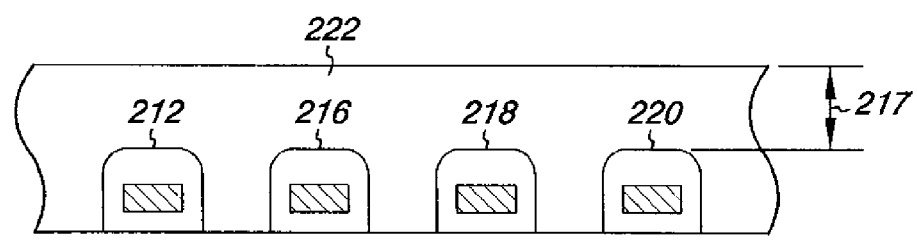
FIG. 2 is a cross-sectional view of an exemplary portion of the embodiment of the contact structure in FIG. 1 after depositing an insulator material.

After the gates have been formed, an insulator material can be deposited. For example, FIG. 2 is a cross-sectional view of an exemplary portion of the embodiment of the contact structure in FIG. 1 after depositing an insulator material. As shown in FIG. 2, an insulator material 222 is deposited over gates 212, 216, 218, and 220 to form an insulator stack layer. This can, for example, be accomplished by depositing a barrier layer (e.g., a thin nitride layer, not shown in FIG. 2) and a spin on dielectric (SOD).

In various embodiments, a thick layer of insulator material may be deposited. For example, the thickness 217 of layer 222 can be 1800 A over the top surface of the gate, in some embodiments. When applied, the upper surface of the insulator material can be planarized to provide a substantially uniform thickness.

Figure 3:
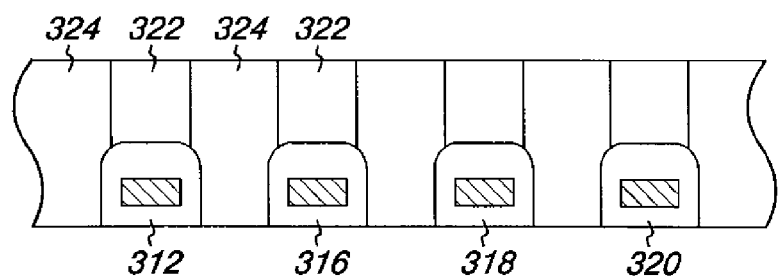
FIG. 3 is a cross-sectional view of an exemplary portion of the embodiment of the contact structure in FIG. 2 after forming a number of contact openings.

FIG. 3 is a cross-sectional view of an exemplary portion of the embodiment of the contact structure in FIG. 2 after forming a number of contact openings. In the embodiment of FIG. 3, contact openings 324 can be formed in the insulator stack layer 322.

The forming of the contact openings can be accomplished, for example by a masking process (e.g., a dual masking process) to pattern discrete contacts in the array. These contact openings can be used to define cell contacts and digit contacts. The forming of the contact opening can be accomplished in a variety of ways. For example, various etch techniques can be used to etch into the insulator layer.

In some embodiments, a number of etch techniques can be combined to form the contact openings. For example, in some embodiments a contact dry etch can be used to form a substantially straight wall for a portion of the depth of the contact opening (e.g., a depth of about 1500 A), then a SAC-type etch as the contact is formed along the side of the gates (e.g., gates 312, 316, 318, and 320, of FIG. 3).

In some embodiments, such combination of etching techniques can allow the area between the gates to be more accurately removed than etching by a single method. Combination of etching techniques can also allow for the maintaining of insulation between a contact and a gate conductor, in some embodiments.

Figure 4:
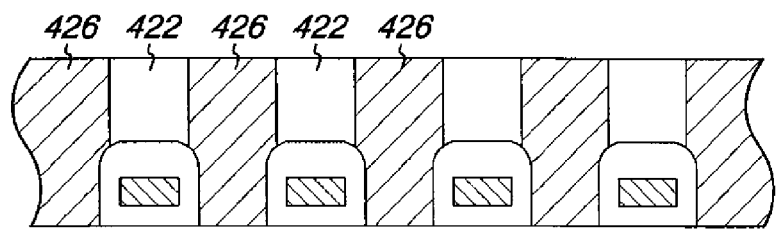
FIG. 4 is a cross-sectional view of an exemplary portion of the embodiment of the contact structure in FIG. 3 after filling with a filler material.

FIG. 4 is a cross-sectional view of an exemplary portion of the embodiment of the contact structure in FIG. 3 after filling with a filler material. As illustrated in FIG. 4, the contact openings formed in the insulator stack layer material 422 can be filled with a filler material 426.

Various filler materials can be used, such that at least a portion of the filler material can be removed during other processes. For example, suitable filler materials can include polysilicon or a sacrificial material. In some embodiments, the material can be of a type that can be etched at about the same rate as an SOD material. This filler material can be planarized to provide a layer having a substantially uniform thickness.

Figure 5A:
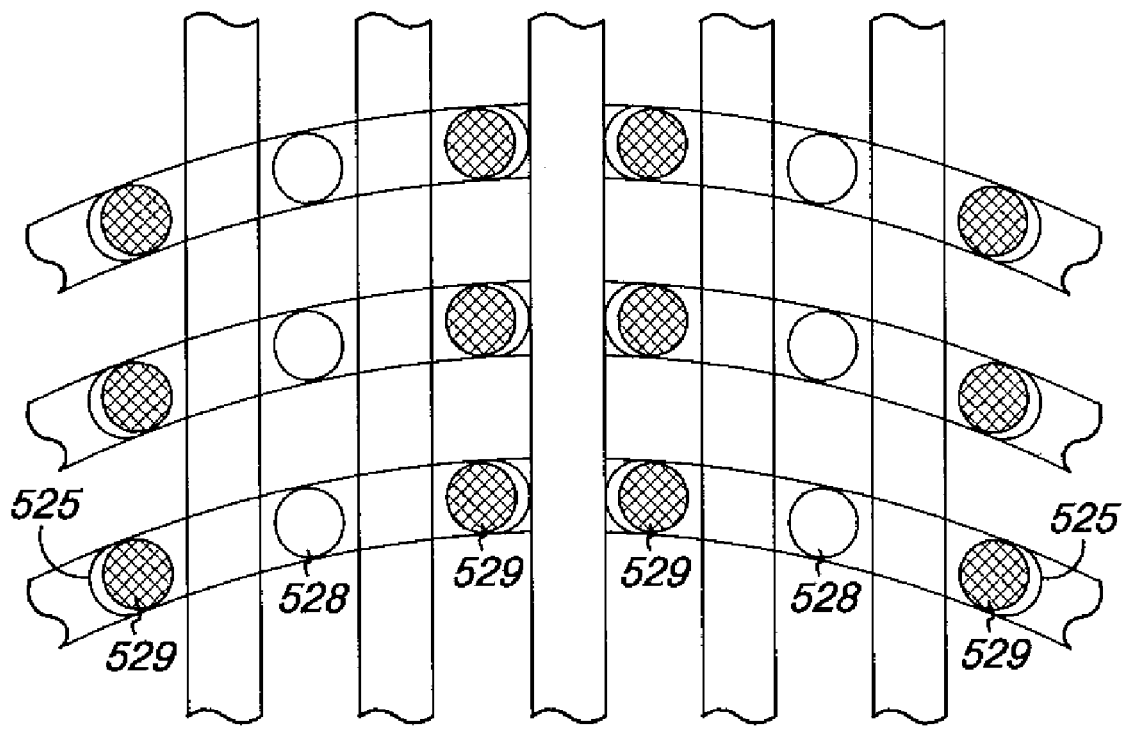
FIG. 5A is a representation of the positioning of a number of digit and cell contacts from an overhead perspective of the embodiment of the contact structure in FIG. 4 after forming a trench structure.
Figure 5A:
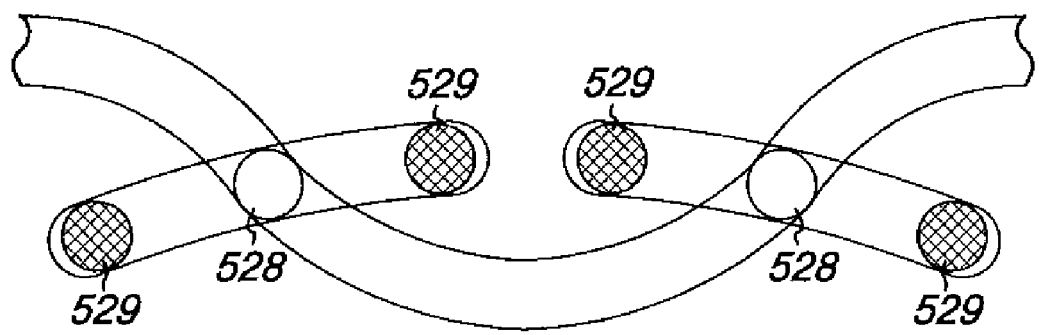

FIG. 5A is a representation of the positioning of a number of digit and cell contacts from an overhead perspective of the embodiment of the contact structure in FIG. 4 after forming a trench structure. In this figure, the representation illustrates cell contacts with hatch and digit contacts with no hatching.

As depicted in the upper portion of FIG. 5A, digit and cell contacts can be grouped into contact groups, for example, is the contacts share resources, such as source, drain and/or active regions. In the embodiment shown in FIG. 5A, the contacts are grouped in groups 525 of three with each group having one digit contact 528 with a cell contact 529 on each side.

FIG. 5A illustrates six such groups arranged on the substrate. However, embodiments can have one or more contacts grouped together and can have one or more groups of contacts.

The bottom portion illustrates an embodiment of the present disclosure in which a trench is formed through the at least one of the digit contacts of the substrate. In the illustrated embodiment of FIG. 5A, the trench 527 is formed through two digit contacts 528. In various embodiments, the trench is formed through all of the digit contacts on the substrate.

Figure 5B:
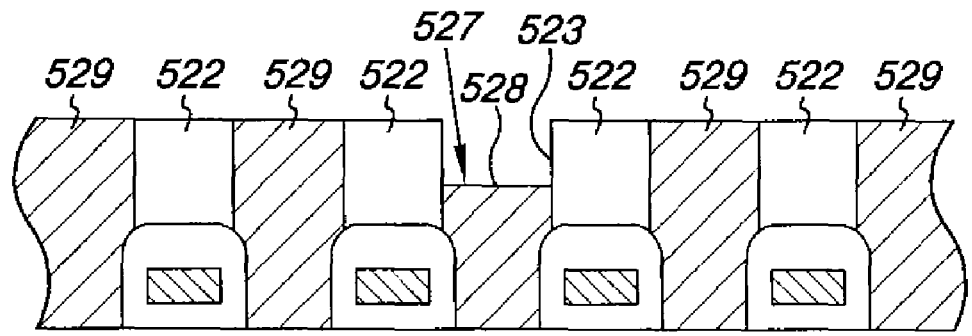
FIG. 5B is a cross-sectional view of an exemplary portion of the embodiment of the contact structure in FIG. 4 after forming a trench structure.

FIG. 5B is a cross-sectional view of an exemplary portion of the embodiment of the contact structure in FIG. 4 after forming a trench structure. In the embodiment of FIG. 5B, the trench 527 is formed in a filler material of a digit contact 528 between two insulative material structures 522. FIG. 5B also shows a number of cell contacts 529.

The trench structure can be formed in the filler material in a variety of manners. That is, as the reader will appreciate, the methods of the present disclosure can utilize a number of different techniques for patterning the different trenches, openings, layers, and other such formations described herein. These can include various deposition, planarization, etching, and/or erosion techniques, among others. For example, the trench can be etched into the filler material. In some embodiments, a damascene trench can formed. When forming the trench, in some embodiments, the filler material and the surrounding SOD material can be etched to form the trench. The depth of the trench (e.g., depth 523 of FIG. 5B) can be various depths. For example, a depth of 1500 A can be suitable in some structures. In some embodiments, a spacer material can be applied to at least a portion of one of the side walls of the trench.

Figure 5C:
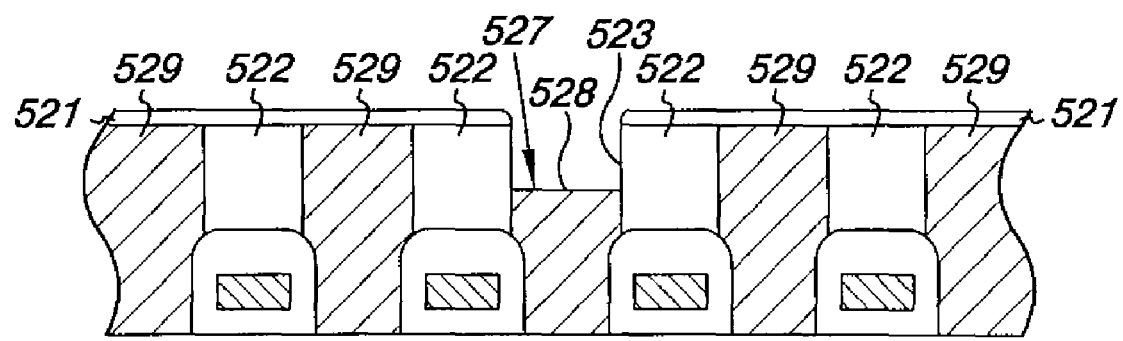
FIG. 5C is a cross-sectional view of an exemplary portion of the embodiment of the contact structure in FIG. 4 after forming a trench structure if a sacrificial material is used.

FIG. 5C is a cross-sectional view of an exemplary portion of the embodiment of the contact structure in FIG. 4 after forming a trench structure if a sacrificial material is used. In the embodiment of FIG. 5C, the trench 527 can be formed as above in a filler material of a digit contact 528 between two insulative material structures 522. FIG. 5B also shows a number of cell contacts 529. However, if a sacrificial material is used during the process, then a protective layer 521 can be provided over the sacrificial (e.g., cell structures 529) and insulative layers 522. The protective layer can, for example, be fabricated from Tetraethyl Orthosilicate, $Si(OC_2H_5)_4$, among other suitable materials.

Figure 6:
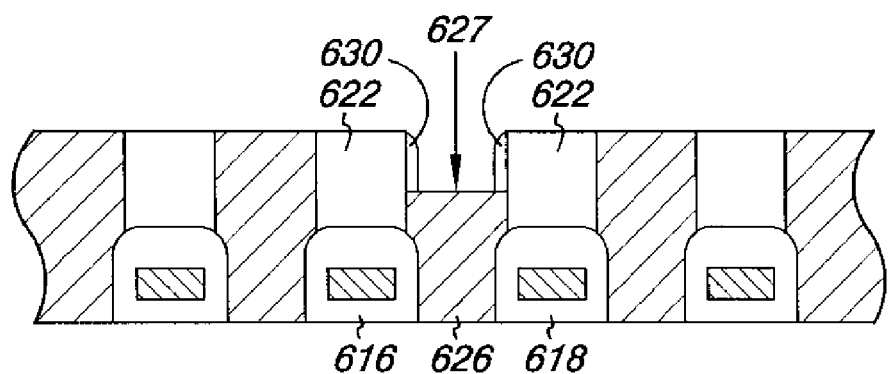
FIG. 6 is a cross-sectional view of an exemplary portion of the embodiment of the contact structure in FIG. 5 after applying a spacer material.

FIG. 6 provides a cross-sectional view of an exemplary portion of the embodiment of the contact structure in FIG. 5B after applying a spacer material. In the embodiment illustrated in FIG. 6, a spacer material 630 is applied on each side wall of the trench 627. This spacer material can be any suitable spacer material. For example, a dielectric material, such as Tetraethyl Orthosilicate or Silicon Nitride, can be used as a spacer material. The spacer material can also be applied in a variety of thicknesses. For example, a thickness of 250 A of spacer material can be applied via chemical vapor deposition (CVD), among other deposition techniques.

If using a sacrificial contact filler material, this material can be removed, for example, after spacer formation. Peripheral contacts can be patterned and plugs, interconnects, openings, and trenches can be filled with conductive material. In some embodiments, the filling of the plugs, interconnects, openings, and trenches can be done at the same time.

Figure 7:
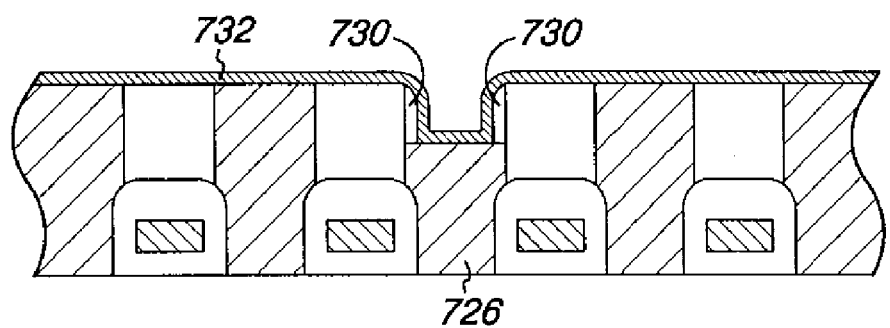
FIG. 7 is a cross-sectional view of an exemplary portion of the embodiment of the contact structure in FIG. 6 after applying a liner material.

FIG. 7 is a cross-sectional view of an exemplary portion of the embodiment of the contact structure in FIG. 6 after applying a liner material. The liner material can be deposited over the trench, the spacer material, and/or the top surface of the insulator and filler materials. For example, the embodiment of FIG. 7 illustrates a deposition over all of these surfaces including the spacer material 730 positioned in the trench formed in filler material 726. A liner material can be used in some embodiments, for example, to form a barrier layer, to adhere one layer to another (e.g., to act as a glue or adhesive), and/or as a low resistance interface layer.

Figure 8:
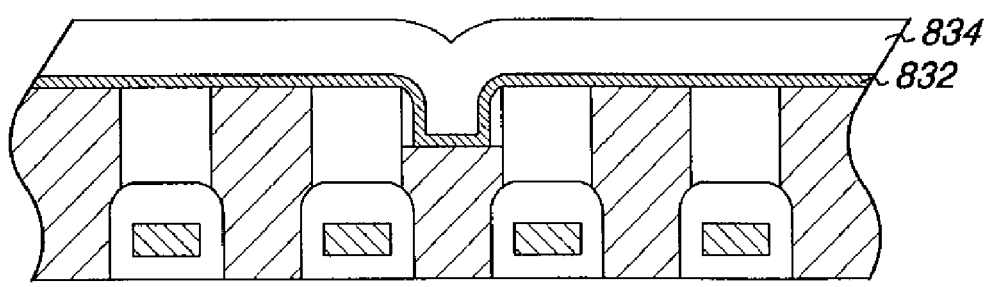
FIG. 8 is a cross-sectional view of an exemplary portion of the embodiment of the contact structure in FIG. 7 after applying a conductor material.

FIG. 8 is a cross-sectional view of an exemplary portion of the embodiment of the contact structure in FIG. 7 after applying a conductor material.

In various embodiments, a conductor material can be deposited over the liner material, including the portions positioned over the trench, the spacer material, and/or the top surface of the insulator and filler materials. For example, the embodiment of FIG. 8 illustrates a deposition of the conductor material 834 over a liner 832 covering all of these surfaces.

In some embodiments, a damascene conductor material can be deposited. Various embodiments utilize different thicknesses of such conductor materials. For example, 75 A Titanium, 75 A Titanium Nitride, and/or 300 A Tungsten (W) can be applied, among other quantities and material types. Embodiments can include filling a number of open contacts with conductive material 834 during the process of depositing the conductive material 834 into the trench. The conductive material is a material selected from the group including: Titanium, Titanium Nitride, Tungsten Nitride, Tungsten, and a combination of at least two of the above materials. For example, Titanium. Nitride and Titanium/Titanium Nitride are two such combinations. Such materials can be used to fill the trench with the conductor material 834.

Figure 9:
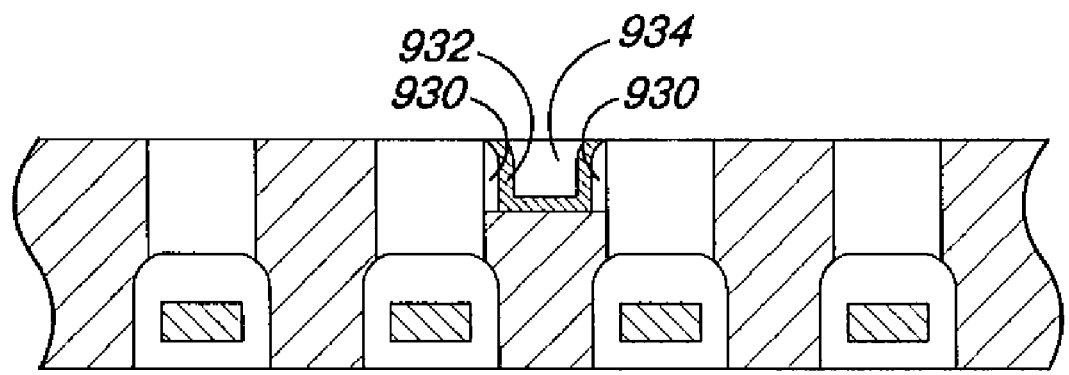
FIG. 9 is a cross-sectional view of an exemplary portion of the embodiment of the contact structure in FIG. 8 after planarizing the conductor material.

FIG. 9 is a cross-sectional view of an exemplary portion of the embodiment of the contact structure in FIG. 8 after recessing the conductor material. The conductor material can be planarized in a variety of manners. If planarization is performed, a top oxide layer of the device can be eroded, for example such that the conductor material and the liner material positioned outside of the trench can be removed.

In the embodiment of FIG. 9, this process can provide a trench structure having a conductor material 934, mounted in a liner 932, and having spacers 930 therein. The erosion can also remove a portion of the insulator and filler materials as the process erodes substantially all of the liner material positioned outside the trench. For example, in one embodiment, the insulator layer (e.g., oxide material) is eroded about 200 A in this process.

Figure 10:
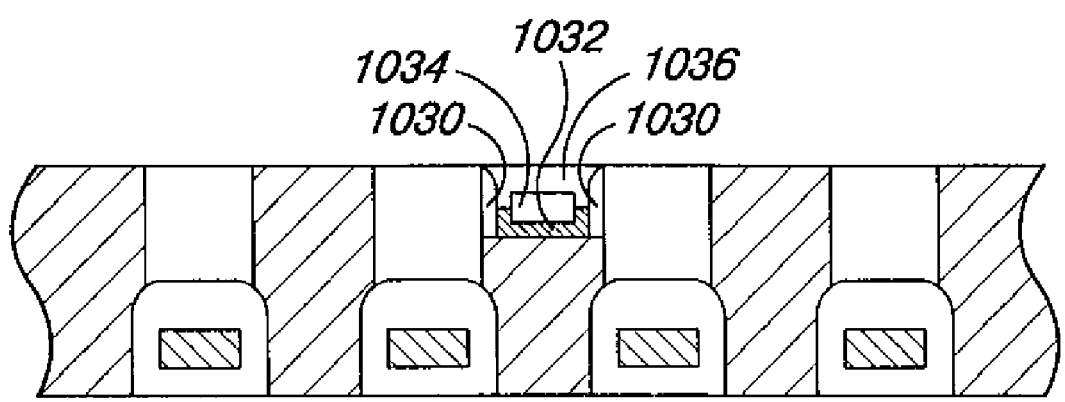
FIG. 10 is a cross-sectional view of an exemplary portion of the embodiment of the contact structure in FIG. 9 after forming a recess and applying a cap material.

FIG. 10 is a cross-sectional view of an exemplary portion of the embodiment of the contact structure in FIG. 9 after applying a cap material. In this process, the conductor material 1034 can be recessed, for example, to provide room within the trench for a cap. For instance, the conductor can be recessed to a depth of about 700 A, among other depths. During this process, the liner material 1032 may also be eroded between the spacer material 1030 and the conductor material 1034.

In various embodiments, a cap material 1036 can be deposited in the recess formed from the removal of the portion of the conductor material 1034 and, in some embodiments, the liner material 1032. For example, a dielectric cap can be deposited over the trench conductor (e.g., Silicon Nitride or Silicon Oxide), to fill the trench. For instance, the cap material can be deposited in a thickness sufficient to cover the conductor material and, in some embodiments, liner material. In some embodiments, the cap can be planarized. During this process, the insulator material and/or the filler material can also be eroded.

Once the contact has been formed in accordance with some or all of the processes described above, various container formation and metallization processes can be accomplished to add further aspects the substrate.

Hence, the present disclosure includes a number of semiconductor structure embodiments. For example, in one such embodiment, the semiconductor structure includes a trench structure having at least one side wall formed in an insulator material, and a spacer material positioned on the at least one side wall. This exemplary embodiment also includes a conductive material positioned within the trench structure and a cap material positioned over the conductive material.

In various embodiments, the trench structure can be a damascene trench structure. The trench structure can be formed along a path over a number of digit contacts and not over a number of cell contacts, in various embodiments. In some embodiments, the trench structure can be formed only over digit contacts. Embodiments can also include a liner material positioned within the trench structure and over at least a portion of the spacer material.

The conductive material can be positioned in a contact opening formed over a number of the digit contacts, for example. In some embodiments, the cap material can be positioned in the contact openings for over the number of the digit contacts. Various types of components can be formed in the active areas. Such components include imaging devices, memory devices or logic devices, among others. Thus, the present disclosure also includes a number of memory device embodiments. For example, in one such embodiment, the memory device includes a semiconductor substrate including a number of contacts, a trench structure positioned over a number of the contacts, the trench structure having at least one side wall formed in an insulator material, a spacer material positioned on the at least one side wall, a conductive material positioned within the trench structure, and a cap material positioned over the conductive material.

The present disclosure also includes a number of integrated circuit embodiments. For example, in one such embodiment, the integrated circuit includes a semiconductor substrate including a number of cell and digit contacts. A trench structure can be positioned over the digit contacts with the trench structure having at least one side wall formed in an insulator material. A spacer material can be positioned on the at least one side wall with a liner material positioned within the trench structure and over at least a portion of the spacer material, in some embodiments. A conductive material can be positioned within the trench structure and a cap material positioned over the conductive material.

A completed integrated circuit can include an array of memory cells for a DRAM or other memory device. In other integrated circuits, logic devices for gate arrays, microprocessors, and/or digital signal processors can be formed in the active regions.

Figure 11:
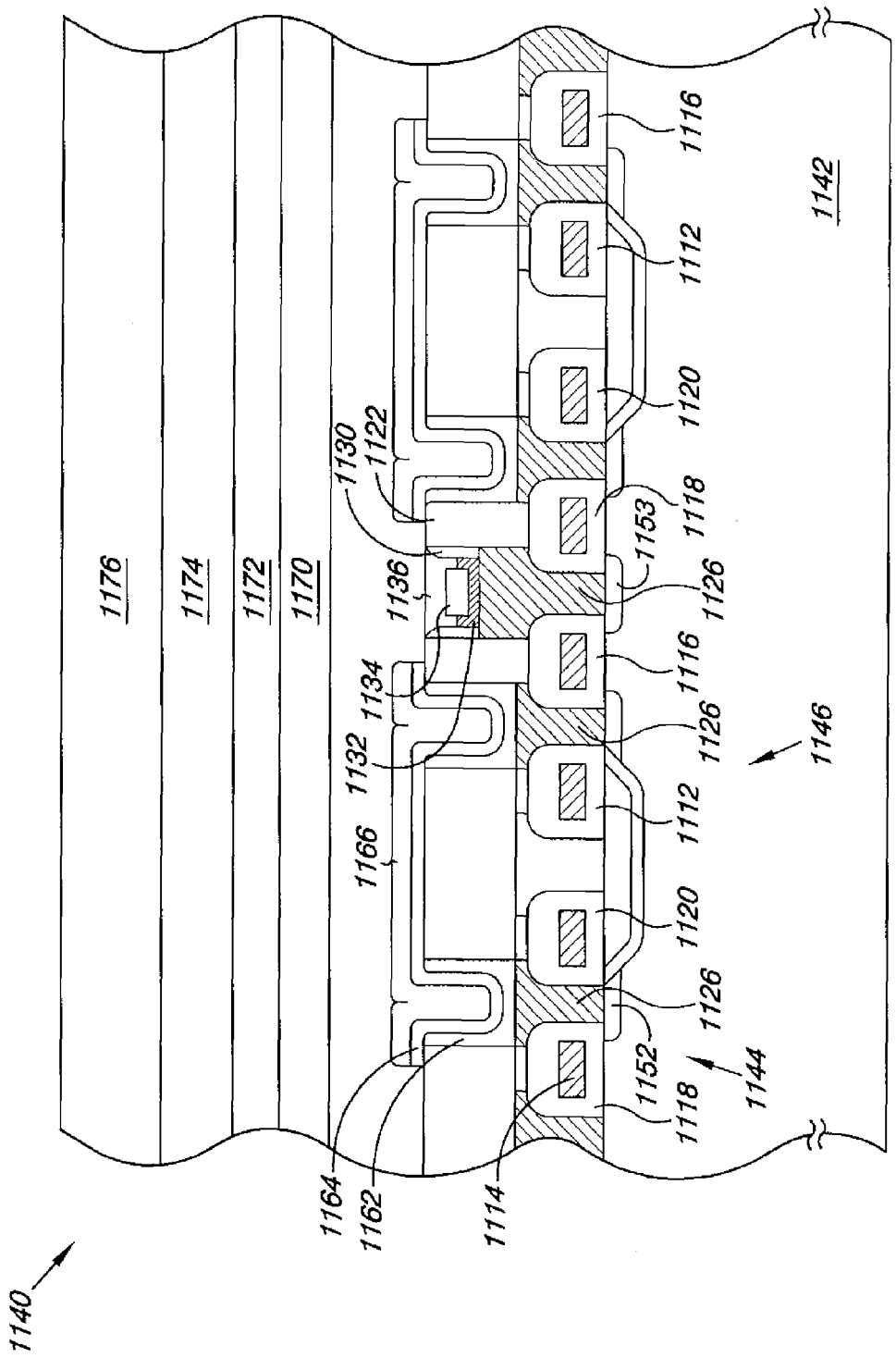
FIG. 11 is a cross-sectional view of an exemplary integrated circuit that includes an embodiment of the contact structures of the present disclosure.

FIG. 11 is a cross-sectional view of an exemplary integrated circuit that includes an embodiment of the contact structures of the present disclosure. The various structures illustrated can be formed using the techniques described above, among others.

In the embodiment of FIG. 11, a stacked-cell DRAM 1140 includes a semiconductor substrate 1142 with multiple active regions 1144 separated by shallow trench isolation regions 1146. Doped regions 1152, 1153 can be formed, for example, by a diffusion implanted process with the regions 1152 serving as storage nodes for memory cells of the DRAM.

Gates 1112, 1116, 1118, and 1120 are provided in the integrated circuit. In various embodiments, one or more of the gates can include nitride or other spacers provided on either side of the gates (not shown). Gates can include a polysilicon layer 1114 and a cap provided by an insulating material, for example. The insulating materials can include, for example, an oxide, a nitride, or a composite such as oxide/nitride or oxide/nitride/oxide combinations, among others.

Gates can also include a barrier metal layer and a metal layer between the polysilicon layer 1114 and the cap. Suitable barrier metal layers include tungsten nitride, titanium nitride, and tantalum nitride, among others. The metal layer can include tungsten, tungsten silicide, titanium silicide, or cobalt silicide, among others. Polysilicon material components 1126 form the contacts to the drain and source regions 1152.

In the illustrated integrated circuit of FIG. 11, capacitor cells comprise lower storage node electrodes 1162, a cell dielectric 1164, and an upper electrode 1166. A metal contact 1168 provides the electrical connection between a digit contact, formed according to an embodiment of the present disclosure, which serves as the bit line and a first metallization layer 1170. As illustrated in the embodiment of FIG. 11, the contact includes spacer material 1130 provided within a trench formed between insulation material structures 1122, a liner 1132, a conductor material 1134, and a cap material 1136.

An insulating layer 1172 can be used to separate the first metallization layer 1170 from a second metallization layer 1174. The semiconductor wafer can be covered by a passivation layer 1176.

Although FIG. 11 illustrates a stacked-cell DRAM, contacts formed according to the techniques described above can be incorporated into any other type of memory such as trench cell DRAMs, flash memory, embedded memory, electrically erasable programmable read only memory (EEPROM), and the like.

Accordingly, the present disclosure also includes a number of electronic system embodiments. For example, in one such embodiment, the system includes a controller; and a memory device coupled to the controller, the memory device having an array of memory cells. Such memory can be a dynamic random access memory device or other such memory component. In various embodiments, the controller can be a processor. Memory cells can include components such as a semiconductor substrate. The substrate can include a number of contacts, a contact structure forming at least one of the contacts. The contact structure can have at least one side wall formed in an insulator material and a spacer material positioned on the at least one side wall. The structure can also include a liner material positioned within the contact structure and over at least a portion of the spacer material, a conductive material positioned within the contact structure, and a cap material positioned over the conductive material.

Figure 12:
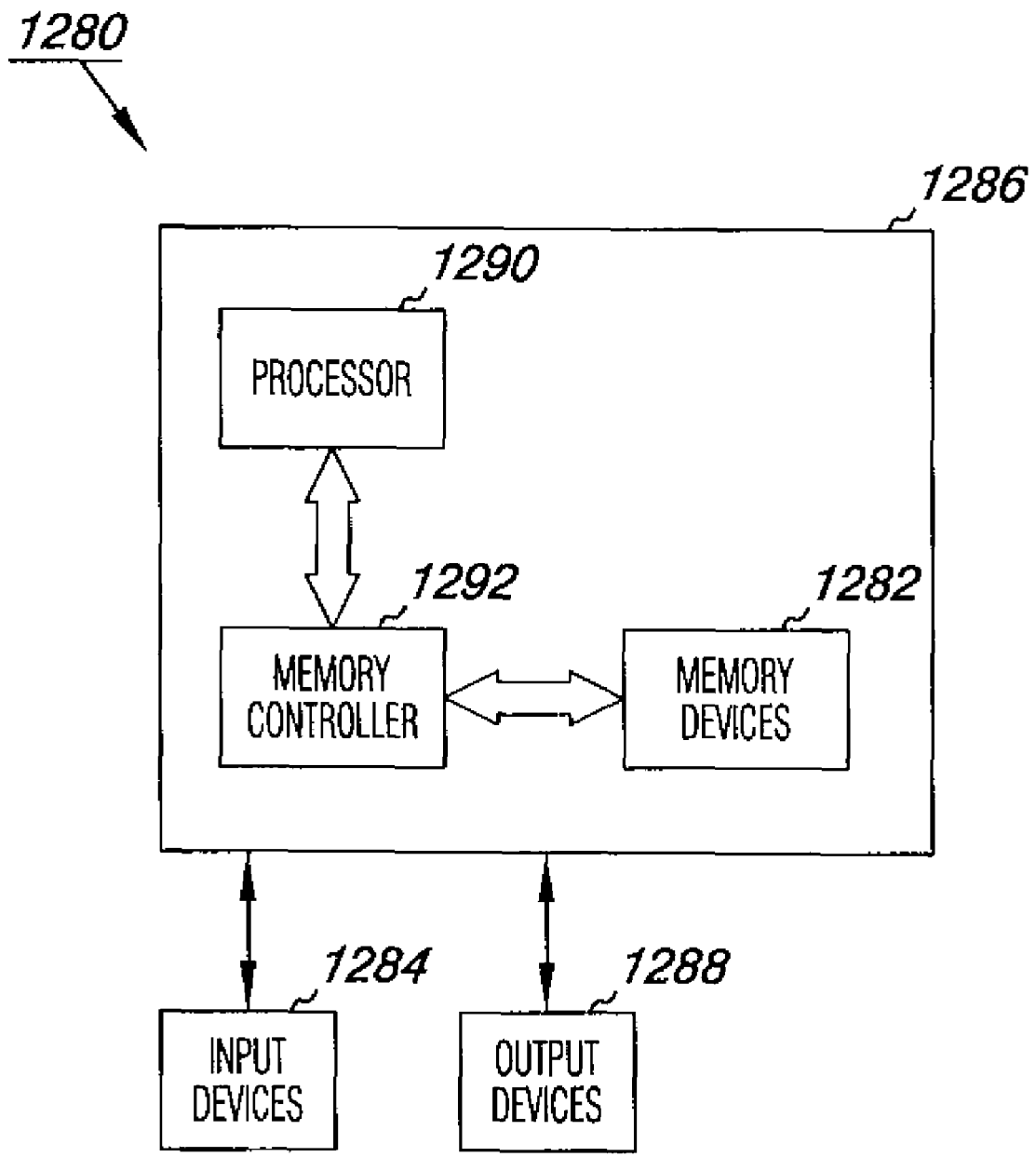
FIG. 12 is an exemplary electronic system that can include embodiments of the contact structures of the present disclosure.

FIG. 12 is an exemplary electronic system that can include embodiments of the contact structures of the present disclosure. Embodiments of the present disclosure can also include an electronic system that incorporates the contacts formed according to embodiments described herein. For example, FIG. 12 provides an embodiment of a processor based system 1280 that includes a memory having contacts formed according to the present disclosure for use in a memory device 1282 and controlled by controller 1292.

As shown in FIG. 12, the system 1280 may also include one or more input devices 1284, e.g., a keyboard, touch screen, transceiver, mouse, etc. The input devices can be connected to the computing unit 1286 to allow a user to input data, instructions, etc., to operate the computing unit 1286.

One or more output devices 1288 connected to the computing unit 1286 may also be provided as part of the system 1280 to display or otherwise output data generated by the processor 1290. Examples of output devices include printers, video terminals, monitors, display units, etc.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of contact formation, comprising:
   forming a trench in an insulator stack material of a particular thickness;
   forming a filler material in the trench and removing the filler material to a particular depth that is less than the particular thickness of the insulator stack material;
   forming a spacer material on at least one side surface of the trench to the particular depth of the filler material, wherein a portion of the filler material remains exposed;
   forming a conductive material in the trench over the filler material; and
   forming a recess in the conductive material into the trench.

2. The method of claim 1, wherein the method includes forming a liner material in the trench over the filler material and the spacer material.

3. The method of claim 1, wherein forming the trench in the insulator stack material includes positioning a portion of the trench between two of a number of gates each having a gate cap.

4. The method of claim 1, wherein forming the filler material in the trench includes depositing a filler material selected from a group that includes a sacrificial material and a polysilicon material.

5. The method of claim 1, wherein forming the spacer material includes depositing the spacer material on at least one side surface of the trench to the particular depth of the filler material.

6. The method of claim 1, wherein the method includes forming a cap material over the conductive material to fill the trench.

7. The method of claim 1, wherein prior to forming the trench in the insulator stack material, forming an insulator stack layer formed from the insulator stack material and wherein the layer has a thickness between a top surface of the layer and a top surface of at least one gate of at least 1800 angstroms.

8. The method of claim 1, wherein the method includes forming the conductive material in a number of open contacts during the process of forming the conductive material in the trench.

9. The method of claim 1, wherein forming the conductive material in the trench includes depositing a conductive material into the trench selected from the group including:
   Titanium;
   Titanium Nitride;
   Tungsten Nitride;
   Tungsten; and
   a combination of at least two of the above materials.

10. The method of claim 1, wherein the method includes forming the filler material in a number of open contacts.

11. A method of contact formation, comprising:
    forming an insulator material of a particular thickness to form an insulator stack;
    forming a first contact opening;
    forming a filler material in the first contact opening;
    forming a trench having at least one side surface in the filler material, wherein the filler material is removed to a depth that is less than the particular thickness of the insulator material;
    forming a spacer material on the at least one side surface to the depth of the trench in the filler material, wherein a portion of the filler material remains exposed;
    forming a conductive material in the trench over the filler material; and
    forming a recess into the trench by removing a portion of the conductive material.

12. The method of claim 11, wherein the method includes forming a liner material in the trench over the filler material and the spacer material.

13. The method of claim 12, wherein the method includes forming the conductive material in the trench over the liner material and forming the recess into the trench by removing a portion of the liner material.

14. The method of claim 11, wherein the method includes performing a dual masking technique to pattern a number of contacts in a contact array to a depth of at least 1500 angstroms prior to forming the filler material in the first contact opening.

15. The method of claim 14, wherein forming the trench includes etching the filler material and the insulator material.

16. The method of claim 11, wherein forming the spacer material on the at least one side surface includes applying a spacer dielectric to line the trench side wall.

17. The method of claim 11, wherein forming a spacer material on the at least one side surface includes applying a material to a thickness of approximately 250 angstroms.

18. The method of claim 11, wherein the method includes forming conductive material in a number of periphery contact openings and interconnects during the process of forming the conductive material in the trench.

19. A method of contact formation, comprising:
    forming a trench structure along a path over a number of digit contacts and not over a number of cell contacts associated with a semiconductor substrate;
    forming the trench structure positioned over the number of the digit contacts with at least one side wall formed in an insulator material of a particular thickness;
    forming a spacer material on the at least one side wall,
    forming a conductive material within the trench structure; and
    forming a recess iin the conductive material into the trench.

20. The method of claim 19, wherein the method includes forming the filler material in the trench structure and removing the filler material to a particular depth that is less than the particular thickness of the insulator material.

* * * * *

UNITED STATES PATENT AND TRADEMARK OFFICE
CERTIFICATE OF CORRECTION

PATENT NO. : 8,377,819 B2
APPLICATION NO. : 13/237126
DATED : February 19, 2013
INVENTOR(S) : James Mathew et al.

It is certified that error appears in the above-identified patent and that said Letters Patent is hereby corrected as shown below:

In the Claims:

In column 10, line 57, in Claim 19, delete "wall," and insert -- wall; --, therefor.

In column 10, line 60, in Claim 19, delete "iin" and insert -- in --, therefor.

Signed and Sealed this
Fourteenth Day of May, 2013

Teresa Stanek Rea
*Acting Director of the United States Patent and Trademark Office*